United States Patent [19]

Suh

[11] Patent Number: 5,754,071

[45] Date of Patent: May 19, 1998

[54] DIGITAL SIGNAL DELAYING METHOD AND CIRCUIT

[75] Inventor: Inh-seok Suh, Suwon, Rep. of Korea

[73] Assignee: Samsung Aerospace Industries, Ltd., Kyongsangnam-do, Rep. of Korea

[21] Appl. No.: 663,772

[22] Filed: Jun. 14, 1996

[30] Foreign Application Priority Data

Jun. 17, 1995 [KR] Rep. of Korea ................. 1995-16155

[51] Int. Cl.$^6$ ................................................. H03K 5/135
[52] U.S. Cl. ....................... 327/279; 327/265; 327/263
[58] Field of Search ........................ 327/261, 263–265, 327/273, 276–279, 286, 298, 299, 293, 227, 151, 160

[56] References Cited

U.S. PATENT DOCUMENTS

| 4,795,984 | 1/1989 | Janssen | 327/273 |
| 5,617,452 | 4/1997 | Haulin et al. | 327/264 |
| 5,617,458 | 4/1997 | Jones et al. | 327/265 |

FOREIGN PATENT DOCUMENTS

| 62-281513 | 12/1987 | Japan | 327/279 |
| 63-133715 | 6/1988 | Japan | 327/279 |
| 1422-370 A | 9/1988 | Japan | 327/279 |
| 3-213010 | 9/1991 | Japan | 327/298 |

OTHER PUBLICATIONS

R. E. S. Abdel–Aal, "Synchronous counters provide programmable pulse delays", Electronics, vol. 52, No. 4, pp. 119–121, Feb. 15, 1979.

Primary Examiner—Timothy P. Callahan
Assistant Examiner—Eunja Shin
Attorney, Agent, or Firm—Finnegan, Henderson, Farabow, Garrett & Dunner, L.L.P.

[57] ABSTRACT

A digital signal delay circuit includes a first pair of counters for setting a starting point of a digital output signal by counting an adjustably set number of clock pulses corresponding to an intended time delay from a starting point of a digital input signal. The circuit further includes a second pair of counters for setting an ending point of the digital output signal by counting an adjustably set number of clock pulses corresponding to an intended output pulse width from an ending point of the digital input signal. The state of the digital output signal is only determined by the state of the output signal of the last counter in the first pair of counters. The output signal from the last counter in the first pair of counters controls a count starting point of the first counter in the second pair of counters. The output signal from the second pair of counters controls an initializing point on which the state of the output signal from the last counter in the first pair of counters is inverted.

6 Claims, 4 Drawing Sheets

DIGITAL SIGNAL DELAYING METHOD AND CIRCUIT

BACKGROUND OF THE INVENTION

The present invention relates to a digital signal delaying method and circuit.

In all digital circuits, a stable control signal is an important factor for operation, particularly in products utilizing digital image signal processing, such as camcorders and digital cameras. However, it is often necessary in digital circuits that the control signal be delayed. For example, when the output of a charge-coupled device (CCD) is processed into a digital image signal according to the National Television System Committee (NTSC) standard, a time lag between the control signals occurs. Thus, a delay circuit is required for reducing the time lag. Conventional delay circuits generally comprise monostable multivibrators or shift registers.

FIG. 1 is a block diagram of a conventional delay circuit of the monostable multivibrator type. In FIG. 1, the first monostable multivibrator 1a determines the delay time of the output signal with respect to the input signal using a time constant obtained from an external resistor $R_1$ and capacitor $C_1$. The second monostable multivibrator 1b determines the pulse width of the output signal using a time constant obtained from an external resistor $R_2$ and capacitor $C_2$.

FIG. 2 is a timing diagram for the delay circuit shown in FIG. 1. In FIG. 2, the first signal represents an input signal, and the second signal represents the output signal of the first monostable multivibrator 1a, which is also the input for the second monostable multivibrator 1b. The third signal represents the output signal of the second monostable multivibrator 1b. As shown in FIG. 2, the first signal is delayed by the first monostable multivibrator 1a for an intended delay time. This delay time is equal to the pulse width of the second signal. Also, the pulse width of the third signal is determined by the second monostable multivibrator 1b.

FIG. 3 is a block diagram of a conventional shift register-type delay circuit. In FIG. 3, reference numerals 3a–3n denote first through $n^{th}$ shift register stages. When an input signal and a driving clock signal are applied to each shift register stage, the input signal is synchronized with the clock signal and delayed by an amount of time determined by the frequency of the clock and the number of shift register stages in the circuit. For example, when a 10 MHz clock signal is applied to a device in which the input signal is to be delayed by eight periods of the clock signal, the input signal is delayed for $8/10,000,000$ second.

FIG. 4 is the timing diagram of the delay circuit shown in FIG. 3. In FIG. 4, the first signal represents the output signal of the first shift register stage 3a, the second signal represents the output signal of the second shift register stage 3b, and the $n^{th}$ signal represents the output signal of the $n^{th}$ shift register stage 3n. As shown, the input signal is sequentially delayed by a predetermined amount of time by each shift register stage.

Although the aforementioned conventional circuits are commonly used in various applications, they suffer from the following limitations. When the delay circuit is a multivibrator type, the output waveform is unstable since the external resistors and capacitors are temperature sensitive and need to have their normal values readjusted due to component variation which occurs in the manufacturing process. Furthermore, it is difficult to package a multivibrator-type delay circuit in a single chip since the capacitor obstructs the integration of the chip.

The conventional shift register-type delay circuit has the following problems. First, it is difficult to adjust the pulse width of the output signal. Second, since the time delayed by a shift register is limited by the cycle of a clock signal, many devices are required in proportion to the delay time. For example, if there is one shift register in which the input signal is delayed by eight periods of the clock signal, then 8 stages are required for a time delay corresponding to 64 clock cycles. Likewise, if a time delay of 256 cycles is needed, then 32 stages would be required. Third, since the clock signal is simultaneously input to all the stages, the noise occurrence ratio increases when the delay time becomes relatively long. Fourth, if the delay time becomes relatively long, then many stages will be required, further complicating integration of the circuit in a chip.

SUMMARY OF THE INVENTION

To overcome the aforementioned problems, it is an object of the present invention to provide a digital signal delaying method, for easily adjusting delay time and pulse width so that a stable output waveform may be provided. It is another object of the present invention to provide an easily integrated digital signal delay circuit.

Additional objects and advantages of the invention will be set forth in part in the description which follows, and in part will be obvious from the description, or may be learned by practice of the invention. The objects and advantages of the invention will be realized and attained by means of the elements, combinations of elements and associated method, as particularly pointed out in the appended claims.

To achieve the above objects and in accordance with the purpose of the invention, as embodied and broadly described herein, there is provided a digital signal delaying method comprising the steps of: determining a starting point for a digital output signal by counting clock pulses corresponding to an intended delay time based on a starting point of a digital input signal; and determining an ending point for the digital output signal by counting the clock pulses corresponding to an intended pulse width based on an ending point of the digital input signal.

In accordance with another aspect of the invention, as embodied and broadly described herein, there is provided a digital signal delay circuit comprising: a delay time determining portion for determining a starting point of a digital output signal by counting clock pulses corresponding to an intended delay time based on a starting point of a digital input signal; and a pulse width determining portion for determining an ending point of the digital output signal by counting clock pulses corresponding to an intended pulse width based on an ending point of the digital input signal.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate one embodiment of the invention and together with the description, serve to explain the principles of the invention. In the drawings.

DESCRIPTION OF THE PREFERRED EMBODIMENT

Reference will now be made in detail to the present preferred embodiment of the invention, an example of which is illustrated in the accompanying drawings. Wherever possible, the same reference numbers will be used throughout the drawings to refer to the same or like parts.

Figure 1:
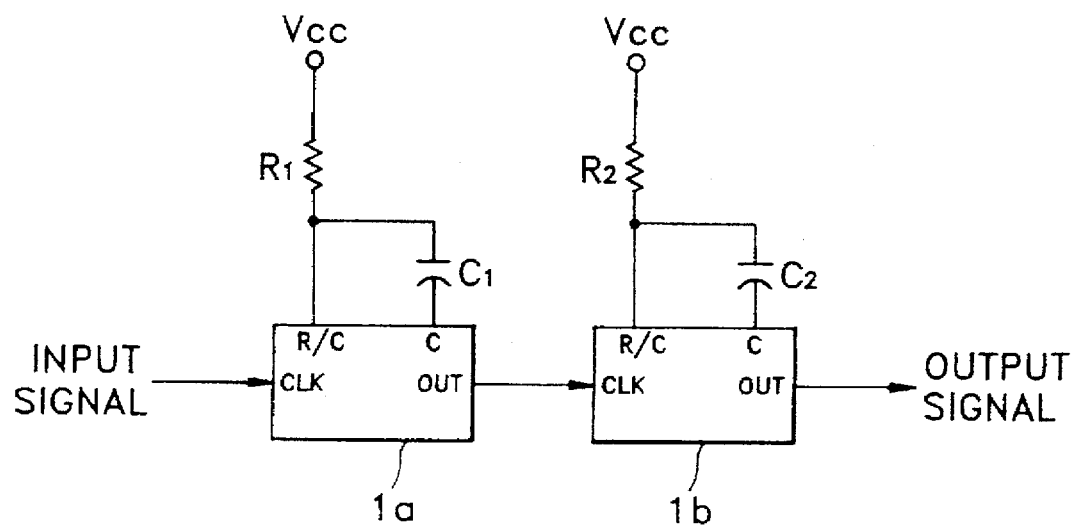
FIG. 1 is a block diagram of a conventional monostable multivibrator-type delay circuit.
Figure 2:
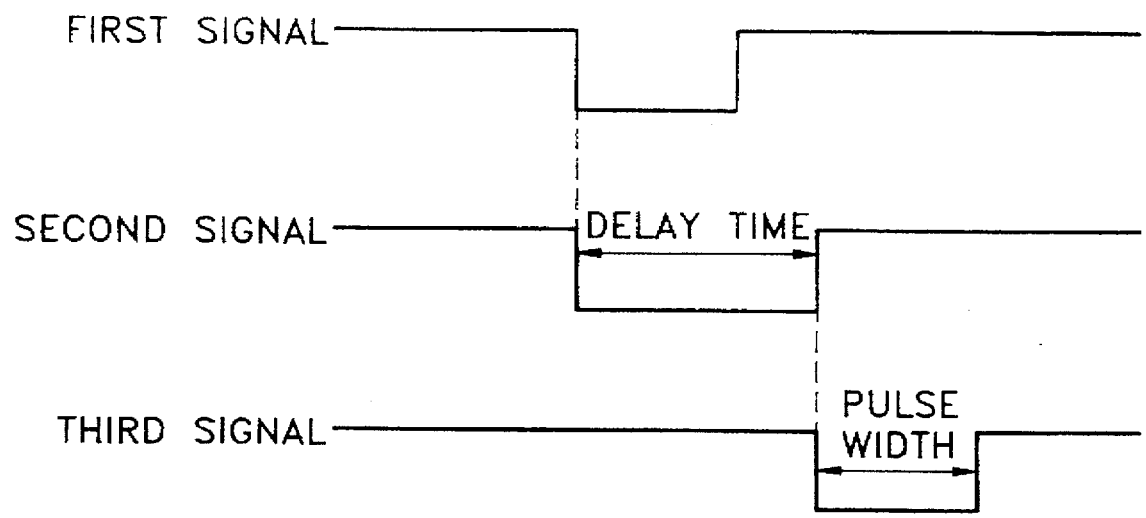
FIG. 2 is the timing diagram of the delay circuit shown in FIG. 1.
Figure 3:
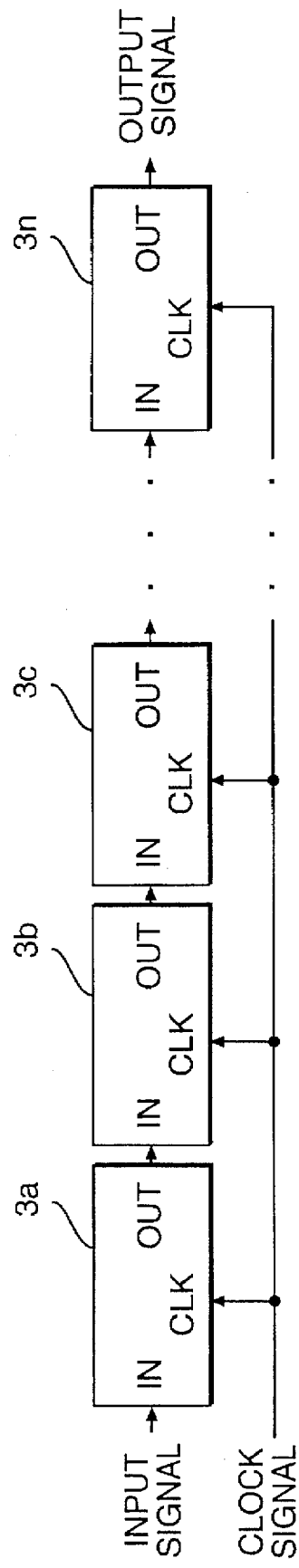
FIG. 3 is a block diagram of a conventional shift register-type delay circuit.
Figure 4:
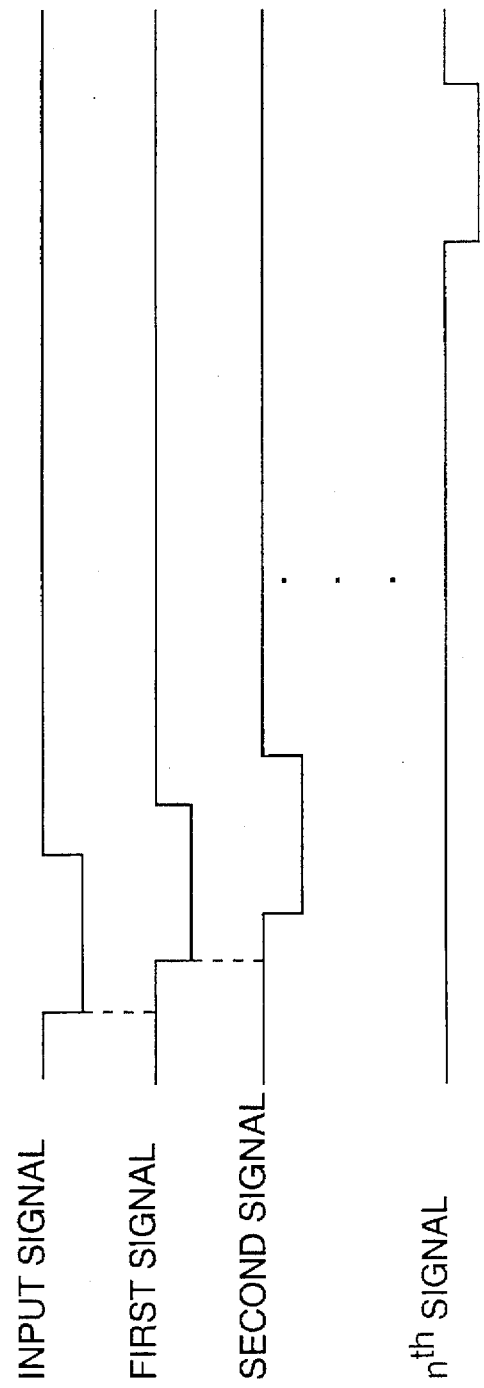
FIG. 4 is a timing diagram of the delay circuit shown in FIG. 3.
Figure 5:
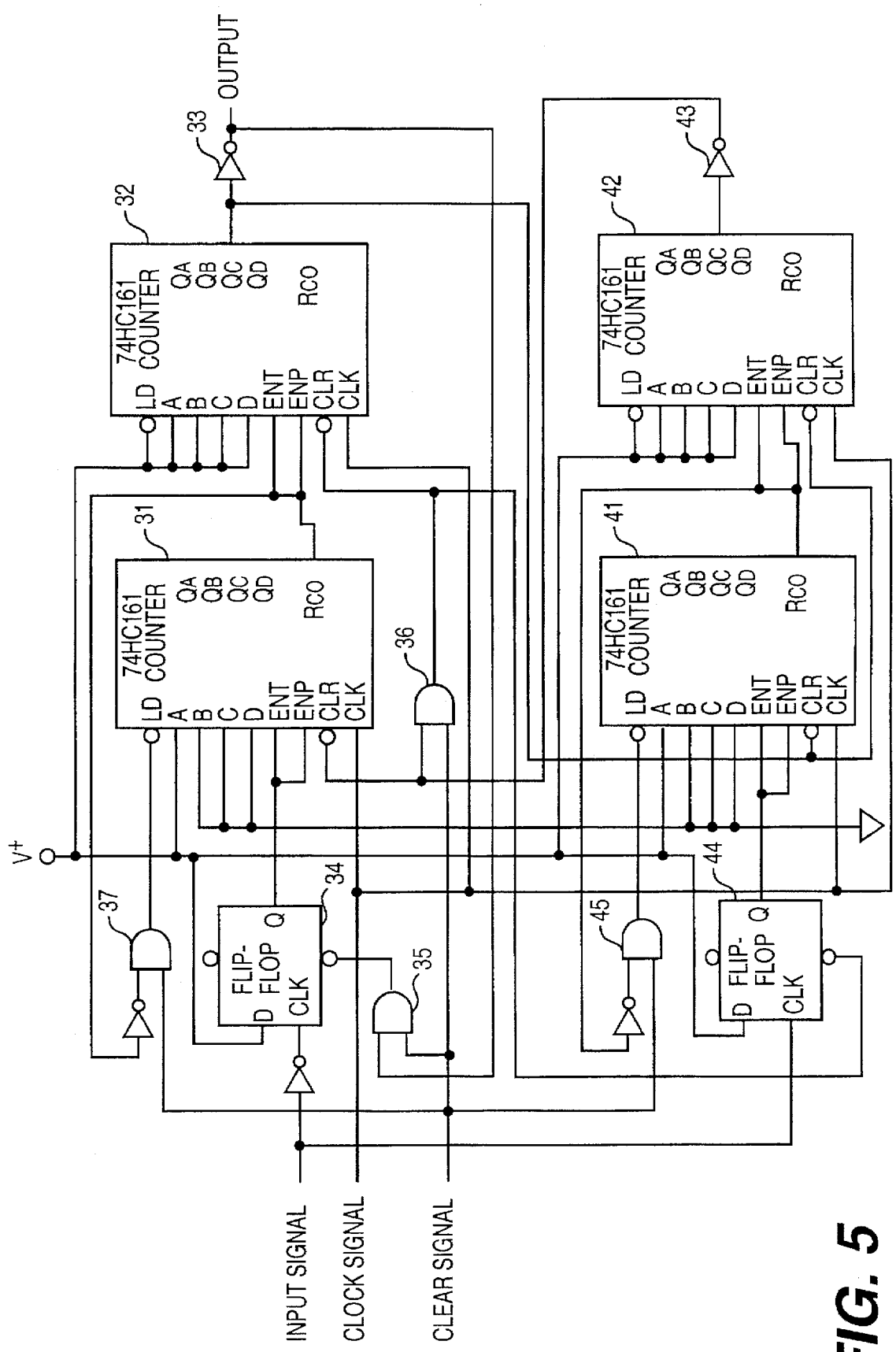
FIG. 5 is a block diagram of a counter-type delay circuit according to a preferred embodiment of the present invention.

As shown in FIG. 5, reference numerals 31 to 37 denote the elements of the delay time determining portion of the counter-type delay circuit. Based on the point when the digital input signal is initiated, i.e., leading edge, this portion of the circuit determines the point when the digital output signal begins by counting clock cycles which correspond to an intended delay time. Reference numerals 41 to 45 denote the elements of the pulse width determining portion of the circuit. Based on the point when the state of the digital input signal changes, this portion of the circuit determines the point when the state of the digital output signal changes by counting clock cycles.

Reference numerals 31, 32, 41 and 42 denote four 74HCL161 4-bit counters used in the preferred embodiment of the present invention. The following table represents the function of each 74HCL161 counter device.

TABLE

| CLK | $\overline{CLR}$ | ENP | ENT | $\overline{LD}$ | FUNCTION |
|---|---|---|---|---|---|
| X | L | X | X | X | CLEAR |
| X | H | H | L | H | COUNT & RC DISABLED |
| X | H | L | H | H | COUNT DISABLED |
| X | H | L | L | H | COUNT & RC DISABLED |
| ↑ | H | X | X | L | LOAD |
| ↑ | H | H | H | H | INCREMENT COUNTER |

As shown in the above table, if the clear input $\overline{CLR}$ is low (L), the clear function is performed regardless of the level of the other inputs. That is, all output bits $Q_A$, $Q_B$, $Q_C$, and $Q_D$ of the counters will be reset to zero. Also, if the count-enable input ENP is low (L), counting is disabled, and if the ripple carry-enable input ENT is low, the ripple carry (RC) and the count functions are disabled. On the other hand, if the load input $\overline{LD}$ is in a low level state (L), the binary values assigned to data inputs A, B, C, and D of the counter are transferred to the data outputs $Q_A$, $Q_B$, $Q_C$, and $Q_D$, respectively.

Thus, for a normal counting, a clock signal (CLK) should be applied and the counter incremented, while all inputs, i.e., $\overline{CLR}$, ENP, ENT, and $\overline{LD}$, are in a high level state (H).

Referring to FIG. 5, the following is a description for the operation of the counter-type delay circuit according to the present invention.

Figure 6:
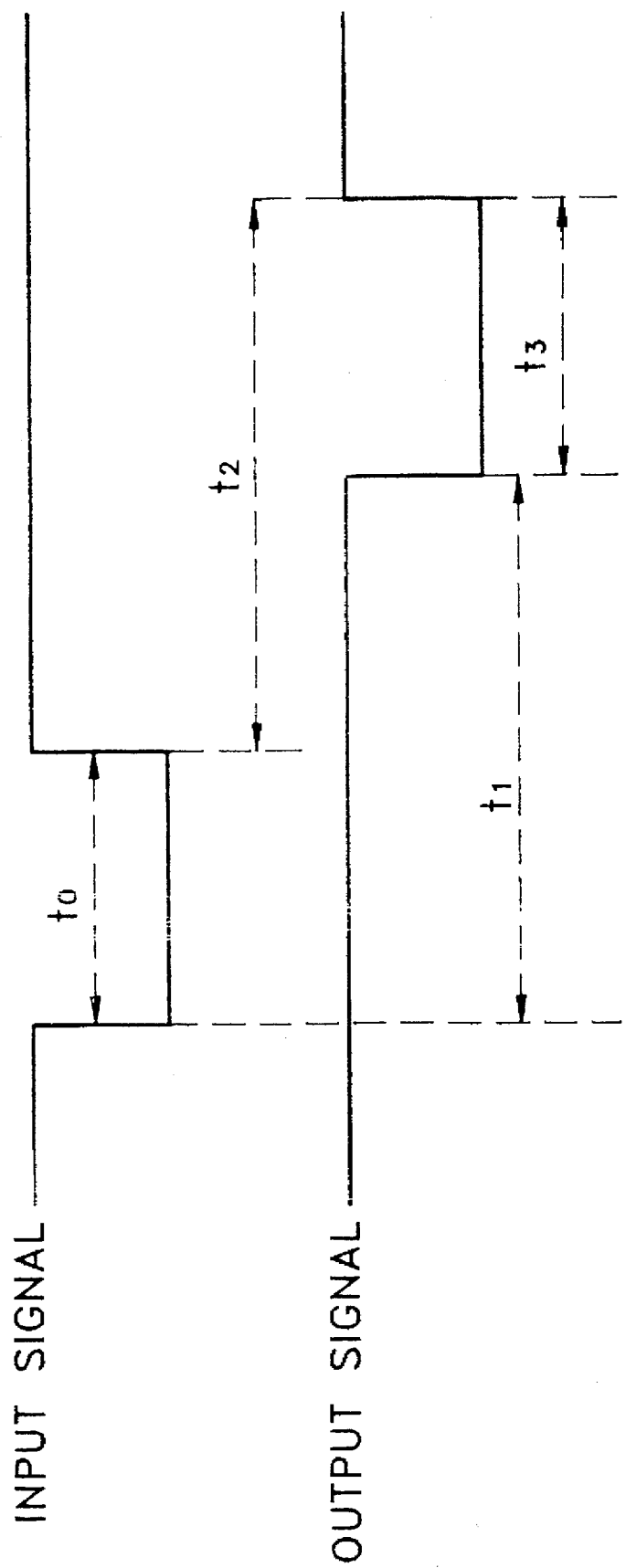
FIG. 6 is the input-output timing diagram of the delay circuit shown in FIG. 5.

No operation occurs after all devices have been cleared by a clear signal unless an input signal is applied. That is, when the clear signal occurs, the first counter 31 is in a load mode and the second through fourth counters 32, 41, and 42 are cleared. FIG. 6 is the input-output timing diagram of the delay circuit shown in FIG. 5. As shown in FIG. 6, a low (L) input signal is applied during the clear state. At this time the Q output of a first D flip-flop 34 goes high (H), which is applied to the ENP and ENT inputs of the first counter 31. Furthermore, the second D flip-flop 44 is held inoperable by the low (L) input signal, which in turn prevents the counter 41 from counting. Here, the first counter 31 starts counting clock cycles while outputting the predetermined values of inputs A, B, C, and D as the initial count values. Thus, the delay time may be adjusted by changing the values of inputs A, B, C, and D.

Since the values of inputs A, B, C, and D (A connected to V+ and B–D grounded) of the first counter 31 are preset to 0001 (a binary number), the ripple carry output ($R_{CO}$) of the first counter 31 is high (H) after counting the $15^{th}$ clock pulse. This signal $R_{CO}$ is fed back to reset the levels of the outputs $Q_A$, $Q_B$, $Q_C$, and $Q_D$ of the first counter 31 and simultaneously enables the second counter 32 to start counting by applying a high level (H) on ENP and ENT. On the other hand, if the load input of the second counter 32 is fixed in a high level state (H), then the values of inputs A, B, C, and D do not influence the levels of outputs $Q_A$, $Q_B$, $Q_C$, and $Q_D$ of the second counter 32, and these outputs are held in a low level state (L) by the clear signal. As shown in FIG. 5, the output $Q_C$ is selected from outputs of the second counter 32 and goes high (H) after the fourth ripple carry output ($R_{CO}$) by the first counter 31 is counted by the second counter 32. Thus, the final output is converted to a low level (L) via the first inverter 33. As a result, the delay time determining portion of the circuit adjusts the delay time ($t_1$) by presetting the data inputs of the first counter 31 with the desired values and by selecting a particular output $Q_A$–$Q_D$ of the second counter 32.

On the other hand, the pulse width determining portion of the circuit is initiated when the input is toggled from the low state (L) to the high state (H). At this time, the output Q of second D flip-flop 44 goes high (H), which in turn enables the third counter 41. When the third counter 41 finishes a preset counting sequence, $R_{CO}$ of the third counter 41 goes high (H), which in turn enables the fourth counter 42. When the fourth counter 42 completes the counting sequence for a predetermined pulse width $t_2$, output $Q_C$ of the fourth counter 42 goes high (H) and is then inverted to a low state (L) by the second inverter 43. Subsequently, the output of AND gate 36 is toggled to a low state (L), which clears the second counter 32 and disables the second D flip-flop 44. As a result, the final output is inverted to a high state (H) via the first inverter 33. That is, the state of the digital output signal (OUTPUT in FIG. 5) is only determined by the state of the output signal of the last counter 32 in the delay time determining portion (31 to 37). The output signal from the last counter 32 in the delay time determining portion (31 to 37) controls a count starting point of the first counter 41 in the pulse width determining portion (41 to 45). The output signal from the pulse width determining portion (41 to 45) controls an initializing point on which the state of the output signal from the last counter 32 in the delay time determining portion (31 to 37) is inverted.

Accordingly, the pulse width determining portion allows adjustment of the time $t_2$ by setting the data inputs A, B, C, and D of the third counter 41 and by selecting a particular output $Q_A$–$Q_D$ of the fourth counter 42. In FIG. 6, the pulse width ($t_3$) of the output signal is determined according to the following formula:

$$t_3 = t_0 + (t_2 - t_1)$$

where $t_0$ is the pulse width of the digital input signal, $t_2$ is the time from the ending point of the digital input signal to the ending point of the digital output signal, and $t_1$ is the intended delay time.

It will be apparent to those skilled in the art that various modifications and variations can be made in the preferred embodiment of the present invention without departing from the scope or spirit of the invention. For example, when the required delay time is short, the delay time can be adjusted between the range of 1 to 16 clock cycles without using the second counter 32. On the other hand, as shown in FIG. 5, when two 4-bit counters are adopted, the delay time can be delayed up to 256 ($16^2$) clock cycles according to the configuration of the circuit. Thus, if n-number of 4-bit counters are adopted, the maximum delay time will be $16^n$ clock cycles. Furthermore, supposing that n-number of k-bit counters are adopted, the maximum delay time can be generalized as $2^{kn}$ clock cycles.

As described above, in the digital signal delaying method and circuit according to the present invention, the delay time and the pulse width can be easily adjusted, the chip holding the circuit can be easily integrated, and a stable output waveform can be provided.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A digital signal delaying circuit comprising:

a delay time determining portion for determining a starting point of a digital output signal by counting clock pulses corresponding to an intended delay time based on a starting point of a digital input signal; and a pulse width determining portion for determining an ending point of the digital output signal by counting clock pulses corresponding to an intended pulse width based on an ending point of the digital input signal, wherein said digital output signal is only determined by an output signal from said delay time determining portion;

said output signal from said delay time determining portion controls a count starting point of said pulse width determining portion; and an output signal from said pulse width determining portion controls an initializing point on which the output signal from said delay time determining portion is inverted.

2. A digital signal delay circuit as claimed in claim 1, wherein said intended pulse width ($t_3$) is determined according to the following formula:

$$t_3 = t_0 + (t_2 - t_1)$$

where $t_0$ is the pulse width of said digital input signal, $t_2$ is the time from the ending point of said digital input signal to the ending point of said digital output signal, and $t_1$ is said intended delay time.

3. A digital signal delay circuit as claimed in claim 2, wherein said intended delay time is from the starting point of said digital input signal to the starting point of said digital output signal.

4. A digital signal delay circuit as claimed in claim 3, wherein said digital signal delay circuit uses counting devices.

5. A digital signal delay circuit as claimed in claim 4, wherein the maximum delay time is proportional to $2^{kn}$ when n-number of a plurality of k-bit counting devices are adopted.

6. A digital signal delay circuit as claimed in claim 4, wherein said intended delay time is determined by selecting a data input value and a data output bit of said counting devices.

* * * * *